United States Patent [19]

Ochiai

[11] Patent Number: 5,324,936
[45] Date of Patent: Jun. 28, 1994

[54] HYBRID OPTICAL/ELECTRICAL CIRCUIT MODULE WITH THERMAL INSULATION

[75] Inventor: Ryoichi Ochiai, Kawasaki, Japan
[73] Assignee: Fujitsu Limited, Kawasaki, Japan
[21] Appl. No.: 993,110
[22] Filed: Dec. 18, 1992

[30] Foreign Application Priority Data
Dec. 20, 1991 [JP] Japan .................. 3-338839

[51] Int. Cl.$^5$ .............................. H01J 7/24
[52] U.S. Cl. .................... 250/238; 250/239
[58] Field of Search .......... 250/238, 239, 227.11, 250/338.2, 338.3; 257/465, 466

[56] References Cited

U.S. PATENT DOCUMENTS

| 4,234,790 | 11/1980 | deMey et al. | 250/238 |
| 4,575,629 | 3/1986 | Schnell et al. | 250/238 |
| 4,803,361 | 2/1989 | Aiki et al. | 250/227 |
| 4,884,125 | 11/1989 | Miura | 357/74 |

FOREIGN PATENT DOCUMENTS 62-281453 12/1987 Japan .

OTHER PUBLICATIONS

Patent Abstracts of Japan, 63-217,648, Jan. 9, 1989.
Patent Abstracts of Japan, 2-007,455, Jan. 11, 1990.
Patent Abstracts of Japan, 2-278,872, Nov. 15, 1990.
Patent Abstracts of Japan, 1-199,483, Aug. 10, 1989.
Patent Abstracts of Japan, 2-306,656, Dec. 20, 1990.

Primary Examiner—David C. Nelms
Attorney, Agent, or Firm—Armstrong, Westerman, Hattori, McLeland & Naughton

[57] ABSTRACT

A hybrid optical/electrical circuit module comprising: a radiation fin assembly (3); an electric circuit (4) which includes no or substantially no optical parts, and is secured to said radiation fin assembly (3) by a first securing means superior in heat conductivity, such that heat from said electric circuit (4) may be effectively removed; and an optical/electrical converter and/or electrical/optical converter (5) to be electrically connected with said electric circuit (4), which includes a decoder and/or coder, and is secured to said radiation fin assembly (3) by a second securing means with no or only a small amount of heat generated thereby, so as not to thermally influence each other.

26 Claims, 24 Drawing Sheets

37

THERMAL CHARACTERISTIC OF THE LD

Fig.29

| CLASSIFICATION | JOINING MATERIAL | HEAT CONDUC-TIVITY(W/m·c) | HEAT PROCESSING TEMPERATURE |
|---|---|---|---|
| METALLIC JUNCTION | AnSn | 251 | 280°C |
| | SILVER BRAZING | 209 | 900°C |
| | SOLDER | 50 | 230°C |
| ORGNIC ADHESIVE | Ag EPOXY | 1 | 150°C |
| | EPOXY | 0.4 | 150°C |
| | LOW-TEMPERATURE HARDENING ADHESIVE (EPOXY OR THE LIKE) | 0.3 | 60°C~80°C |
| MECHANICAL FIXATION | GREASE + SCREW | 0.15 | NO HEATING REQIRED |
| | SCREU ONLY | 0.08 | |

HYBRID OPTICAL/ELECTRICAL CIRCUIT MODULE WITH THERMAL INSULATION

BACKGROUND OF THE INVENTION

1. Field of the Invention

The present invention relates to a hybrid optical/electrical circuit module designed so as to provide a communication between a communications apparatus and a computer.

2. Description of the Related Art

Nowadays, light is used for transmitting signals between communications apparatuses or computers because signals are effectively electrically processed within each of the apparatuses or computers. Thus hybrid optical/electrical circuit modules that have an optical/electrical conversion function are increasingly employed in communication apparatuses and computers.

The hybrid optical/electrical circuit modules are generally classified into two types: an E/O (electrical/optical) module that converts an electric signal to an optical signal and delivers it to the transmission line and an O/E (optical/electrical) module that receives an optical signal from the transmission line and converts it to an electric signal.

The E/O and O/E modules will be described below.

E/O module

FIG. 22 is a schematic block diagram of an E/O module using a laser diode (LD). An electric signal is a ternary signal taking one of three values: +, 0 and −, while an optical signal is a binary signal that is either on or off. An electric signal coming from a transmission line is converted to a binary signal in an interface circuit, changed in transmission speed, scrambled in an encoder circuit and connected to an optical/electrical converter. The electric signal is converted to an optical on/off signal by LD and delivered to the transmission line using an optical fiber. As seen, the interface circuit, encoder circuit, and LD drive circuit are made of a silicon bipolar LSI, GaAs LSI or the like, and the laser diode (LD) is made of a GaAs, InP or the like semiconductor. LD has a temperature dependence of about 1 mA (drive current)/°C. between the drive current and optical output as shown in FIG. 23. The temperature dependence varies from one type of LD to another. Therefore, for assuring a stable optical output, a circuit has to be provided which changes the drive current according to the temperature. For simplifying or omitting this circuit, it is necessary to stabilize the temperature around LD by eliminating the thermal influence from other devices.

As shown in FIG. 22, the electric circuit and E/O converter have a boundary between the encoder circuit and LD drive circuit. However, the present invention is not limited to such an arrangement, but the boundary may be provided between the LD drive circuit and LD. Namely, the electric circuit and E/O converter may be so defined.

O/E module

FIG. 24 is a schematic block diagram of an O/E module using an avalanche photodiode (APD). A received optical signal from an optical fiber is converted to a current signal by the avalanche photodiode (APD) and amplified. The current signal is further amplified by an equalizing amplifier. Generally, however, the amplifier has a varied DC level depending upon the on-off ratio (ratio between on and off) of the signal. A DC regenerative circuit is required for keeping the DC level constant by suppressing the DC variation, and to this end, a clamping circuit is utilized. The output of the clamping circuit is passed through an automatic gain control (AGC) circuit intended to provide an output level with a dynamic range, a clock recovery circuit for discrimination, regeneration and other logical processing and a discriminator/regenerator circuit for discriminating between "1" and "0" and thus taken as an electric signal. Namely, the clamping circuit output is reversely subjected to the processing in the decoder circuit.

As shown in FIG. 24, the boundary between the O/E converter and electric circuit lies between the equalizing amplifier and the clamping circuit. However, the present invention is not limited to this arrangement, but the boundary may be laid in other places.

The avalanche photodiode (APD) is made of an InP.-/In GaAs semiconductor and other circuits are made of a silicon bipolar LSI, GaAs LSI or the like.

For the O/E and E/O modules, it is most important that the electrical/optical converters and/or optical/electrical converters including LD, APD, etc. should accurately be aligned with the optical fiber. FIG. 25 shows the geometrical relation between the LD and the optical fiber, and FIG. 26 shows the relation between the misalignment of the optical axis between the LD and the optical fiber and the coupling loss. Generally, when an LD and a single mold fiber (SM) are used, the allowable misalignment of the optical axis is only 1 μm. Therefore, the development of thermal stress and mechanical stress must be minimized during assembly and after the alignment of the optical axis.

FIGS. 27 and 28 show a conventional electric circuit and E/O converter, respectively. As mentioned above, the development of thermal stress and mechanical stress in the E/O converter must be minimized during assembly and after the alignment of the optical axis between the optical fiber and the optical element. On the other hand, LSI and fins should preferably be joined by a metal junction using a solder or an AuSn alloy or by a junction using a high-temperature conductive organic adhesive, from the standpoint of heat radiation. However, these junction methods are to be done at a temperature as high as 150° C. or more as shown in FIG. 29.

Generally, the power consumption of the E/O and/or O/E converter is small compared with that of the electric circuit. For these reasons, packages are formed for the E/O and/or O/E converter and the electric circuit, respectively. The E/O and/or O/E converter package is assembled by a low temperature process with priority given to the alignment of optical axis while the electric circuit package is assembled by a high temperature process primarily for heat radiation. These packages are mounted separately on a mother board.

With a higher transmission speed (50 to 640 Mb/s or more) and parallel transmission (tens channels), the power consumption increases correspondingly. To shorten the time for signal transmission, the module must be designed more compact, which however conflicts with the increased power consumption. The present invention has an object to overcome the above-mentioned drawbacks and inconsistency in design and lower the manufacturing costs by reducing the number of components and improving the manufacturabiity of the optical/electrical circuit module. Namely, the present invention seeks to solve the following problems:

(1) Integral packaging of electric circuit and E/O and/or O/E converter
(2) Improved heat radiation
(3) Reduced number of components and improved assembling capability at a lower manufacturing cost.

SUMMARY OF THE INVENTION

To achieve the above object, according to the present invention, there is provided a hybrid optical/electrical circuit module comprising: a radiation fin assembly; an electric circuit that includes no or substantially no optical parts, and is secured to said radiation fin assembly by a first securing means superior in heat conductivity, such that heat from said electric circuit may by effectively removed; and an optical/electrical converter and/or electrical converter to be electrically connected with said electric circuit, which electric circuit includes a decoder and the optical/electric converter or coder, and is secured to said radiation fin assembly by a second securing means with no or only a small amount of heat generated thereby, so as not to thermally influence each other.

BRIEF DESCRIPTION OF THE DRAWINGS

These and other objects of the present invention will become apparent from the following detailed description of the preferred embodiment of the invention, taken in connection with the accompanying drawings.

In the drawings:

FIG. 29 shows the relation between the bonding method and thermal resistance.

DESCRIPTION OF THE PREFERRED EMBODIMENTS

The embodiment of the present invention will be explained below with reference to the drawings.

Figure 1:
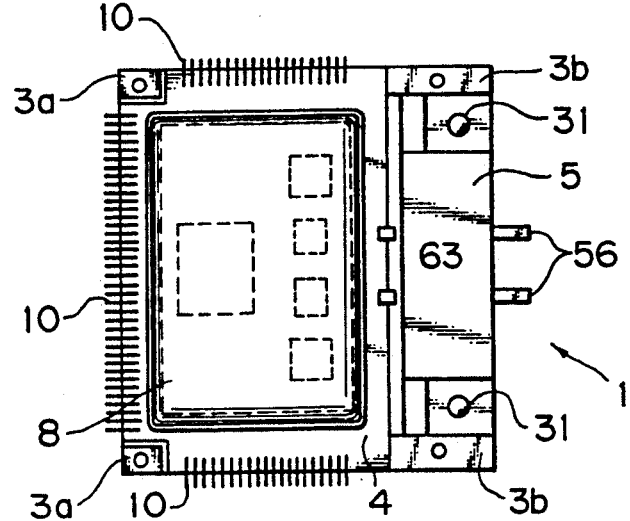
FIG. 1 is a plane view of an embodiment of a hybrid optical/electrical circuit according to the present invention.
Figure 2:
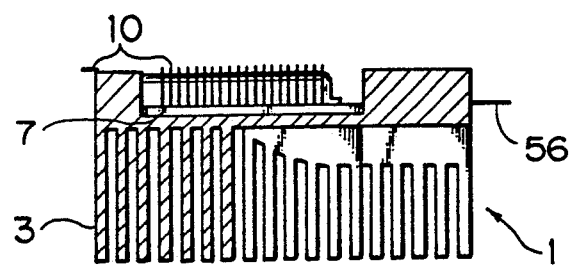
FIG. 2 is a sectional side elevation of the embodiment of the module.
Figure 3:
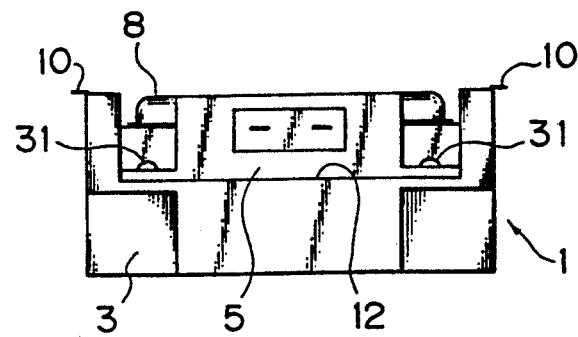
FIG. 3 is a right side elevation of the embodiment of the module.

FIGS. 1 to 3 show an embodiment of the hybrid optical/electrical circuit module according to the present invention.

Figure 4:
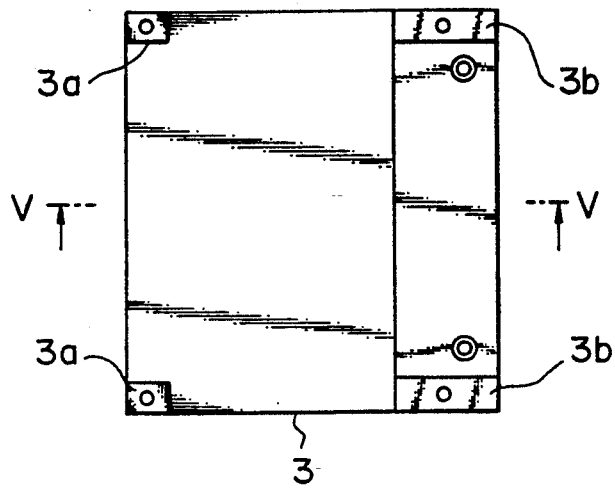
FIG. 4 is a plane view of the radiation fin assembly.
Figure 5:
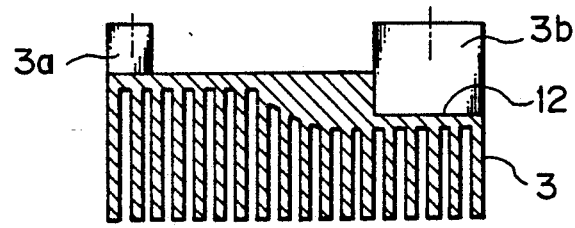
FIG. 5 is a sectional view taken along the line V—V in FIG. 4.
Figure 6:
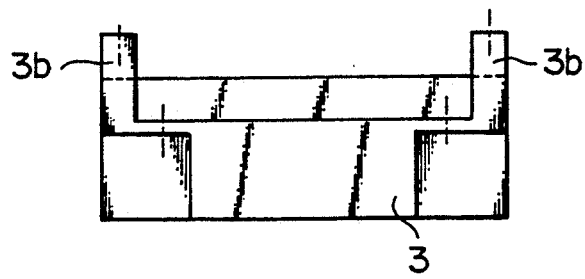
FIG. 6 is a right side elevation of the radiation fin assembly.

In these Figures, the hybrid optical/electrical circuit module (will be referred to as "module" hereafter) 1 according to the present invention comprises an electric circuit 4 and a E/O and/or O/E converter 5 integrally mounted on a radiation fin assembly 3 having four stems 3a and 3b shown in FIGS. 4 to 6.

Figure 27:
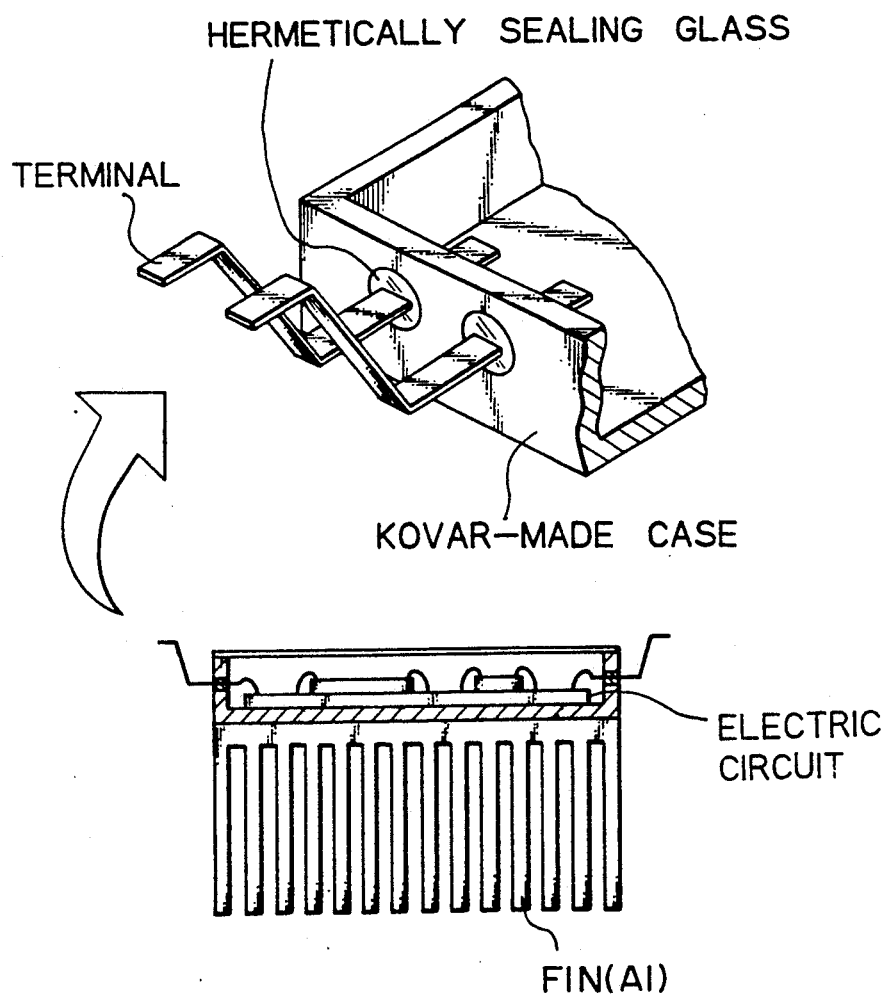
FIG. 27 is a cross sectional view of a conventional electric circuit.
Figure 28:
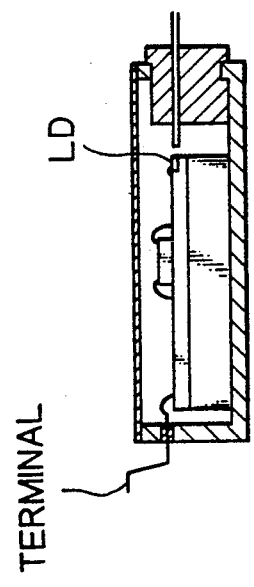
FIG. 28 is a cross sectional view of a conventional E/O converter.
Figure 30:
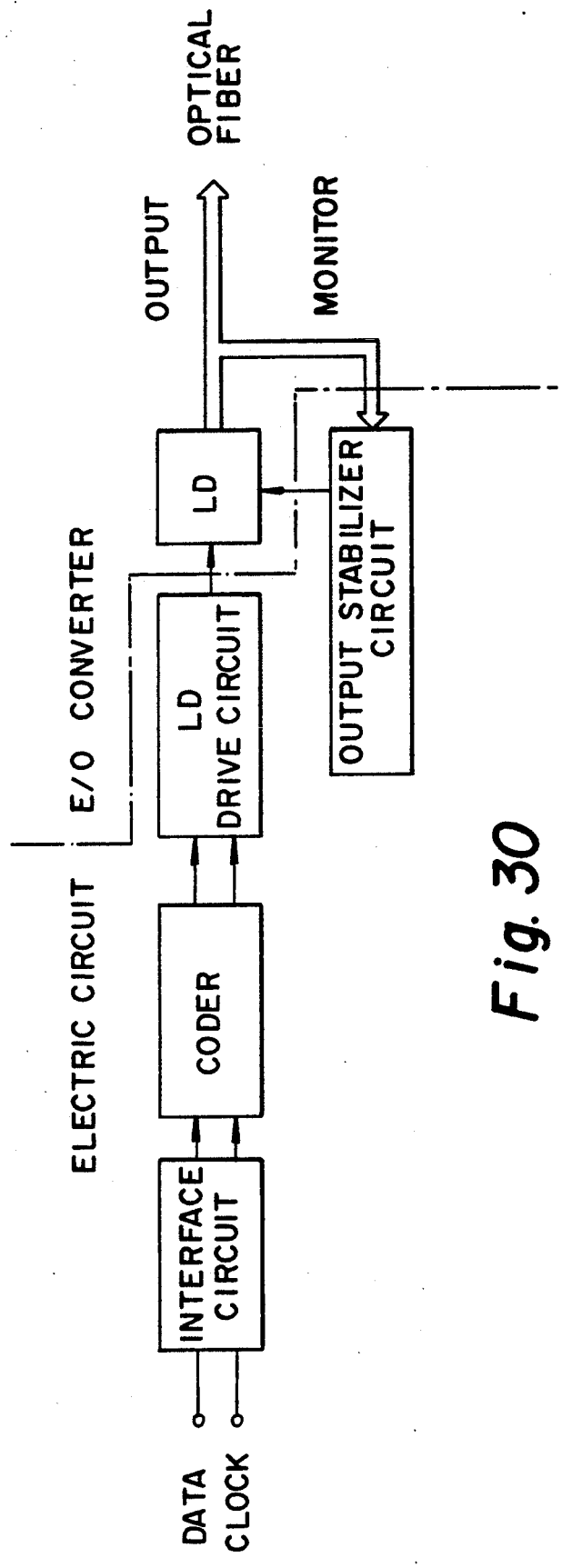
FIG. 30 shows a schematic block diagram of an electro-optic mode

The electric circuit 4 has a high-temperature radiation substrate 7 joined directly to the top of the radiation fin assembly 3. Various components mounted on the high-temperature radiation substrate 7 are covered with a sealing case 8. The reference numeral 10 denotes interconnecting terminals that electrically connect the electric circuit 4 to the outside. The interconnecting terminals 10 are joined to the high-temperature radiation substrate 7 by a silver brazing. Namely, these interconnecting terminals 10 are not adapted to penetrate, as in the conventional module (as in FIGS. 27 and 28), the Kovar-made case housing the electric circuit (see the detail view of the terminal in FIG. 27). The pitch of the interconnecting terminals 10 can be extremely (1 mm or less) and the module can be produced at a reduced cost.

The E/O and/or O/E converter 5 is fixed as fitted in a recess 12 formed in the radiation fin assembly 3 at a level one step lower than the top of the latter and it is electrically connected to the electric circuit 4. The E/O and/or O/E converter 5 is fixed with a screw 31. The E/O and/or O/E converter 5 itself is hermetically sealed, which will be discussed in further detail later.

Figure 7:
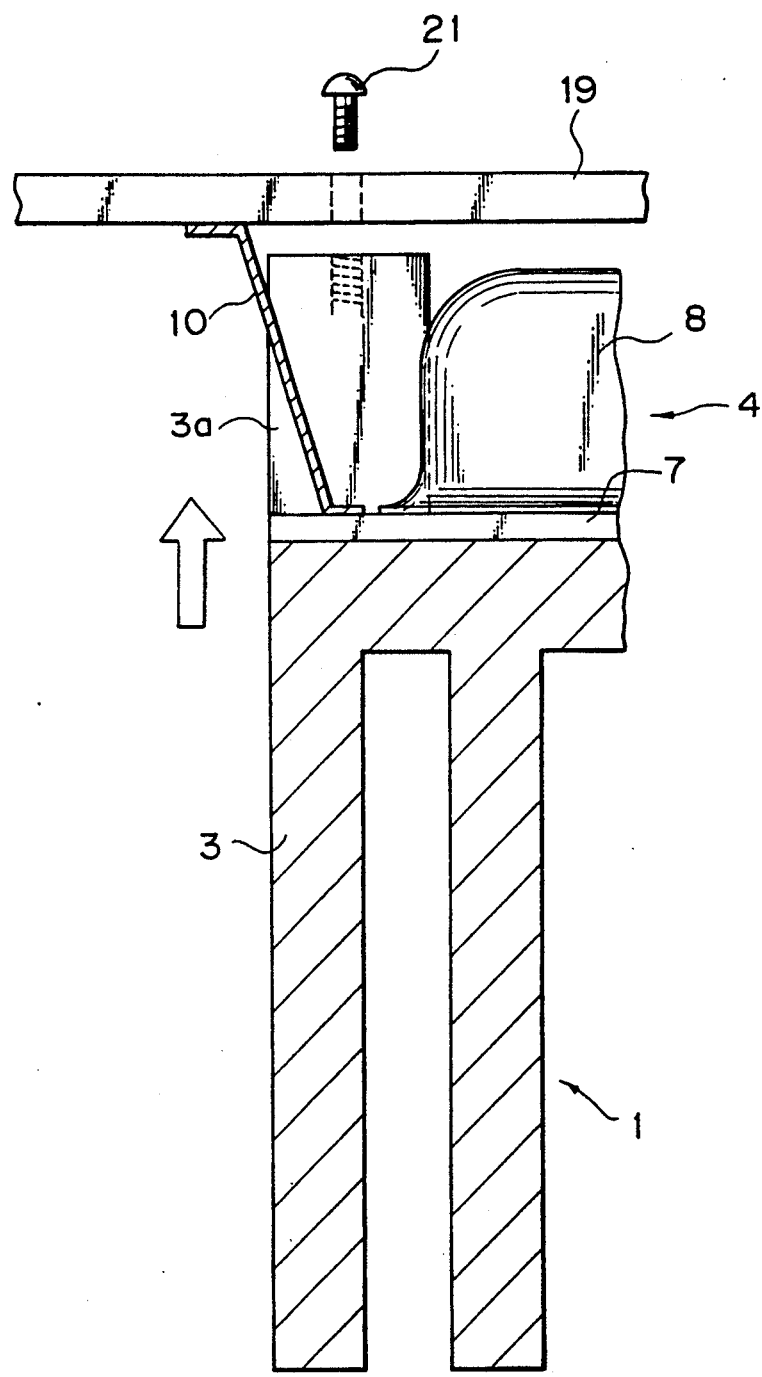
FIG. 7 is a view, enlarged in scale, of the fixation of the module.
Figure 8:
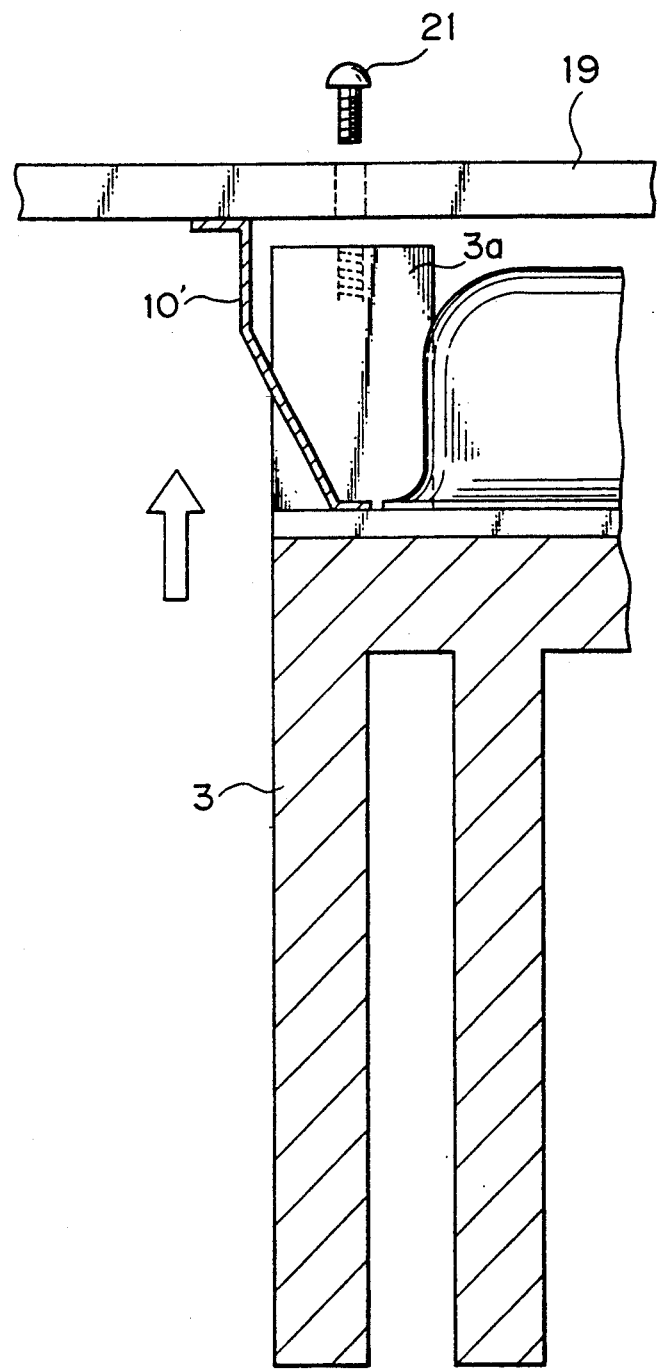
FIG. 8 is a view, enlarged in scale, of the fixation of a variant of the module.

As partially shown in FIG. 7, for mounting the module 1 according to the present invention to a specified circuit board 19, first the interconnecting terminals 10 on the radiation fin assembly 3 are put in contact with and engaged on the circuit board 19 with a predetermined clearance defined between the circuit board 19 and the stems 3a of the radiation fin assembly 3 (module 1). When the module 1 is fixed to the circuit board 19 by driving a screw 21 into the stem 3a from outside the circuit board 19, the interconnecting terminals 10 are elastically deformed so that a predetermined contact pressure develops between the circuit board 19 and interconnecting terminals 10. The interconnecting terminals thus in contact with the circuit board 19 are soldered to the latter, which ensures a reliable junction. The interconnecting terminal may be slightly bent at the middle thereof as shown in FIG. 8 (terminal 10').

Assembly of the embodiment of the module 1 having the above-mentioned structure according to the present invention will be described below with reference to FIG. 9.

Figure 9A:
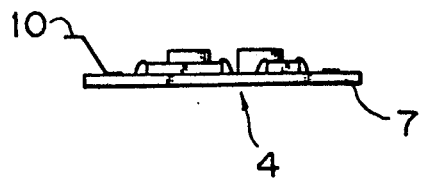
FIG. 9(A)-9(B) show the process of assembling the embodiment of the module.

First, SMD is mounted on the high-temperature radiation substrate 7 and wire-bonded to form the electric circuit 4 (as in FIG. 9(A)).

Figure 9B:
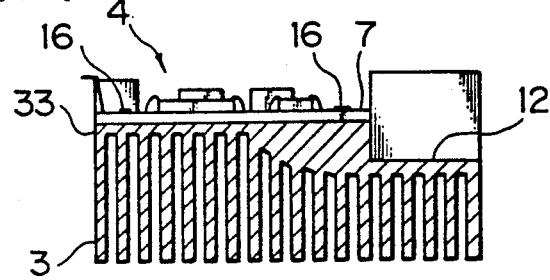

Next, the electric circuit 4 is joined to the radiation fin assembly 3 made of an aluminum alloy with a silicon adhesive layer 33 made of, for example, a high-temperature conductive resin in a heating/bonding process in which a low thermal resistance is ensured (as in FIG. 9(B)). The electric circuit 4 has mounted thereon mainly highly heat-dissipative LSIs that will not be thermally influenced by the heating process in which the maximum temperature is in the order of 200° C.

Figure 9C:
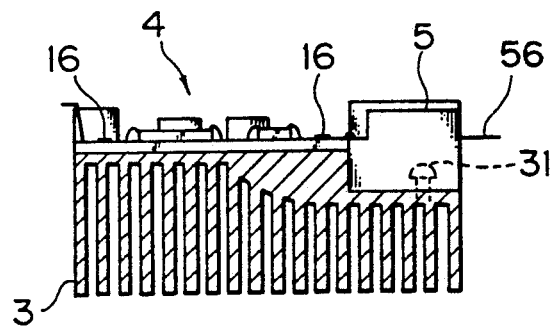

Further, the E/O and/or O/E converter 5 having optical fibers 14 projecting outward (to the right in Figure) is fitted in the recess 12 formed in the right end portion of the radiation fin assembly 3 at a level one step lower than the latter, and fixed by a fixing means with no heat (no-heating process), for example, screw 31 (as in FIG. 9(C)).

Then the electric circuit 4 and E/O and/or O/E converter 5 are electrically connected to each other, and the resistor and capacitor on the electric circuit 4 are adjusted for a predetermined circuit characteristic.

Figure 10:
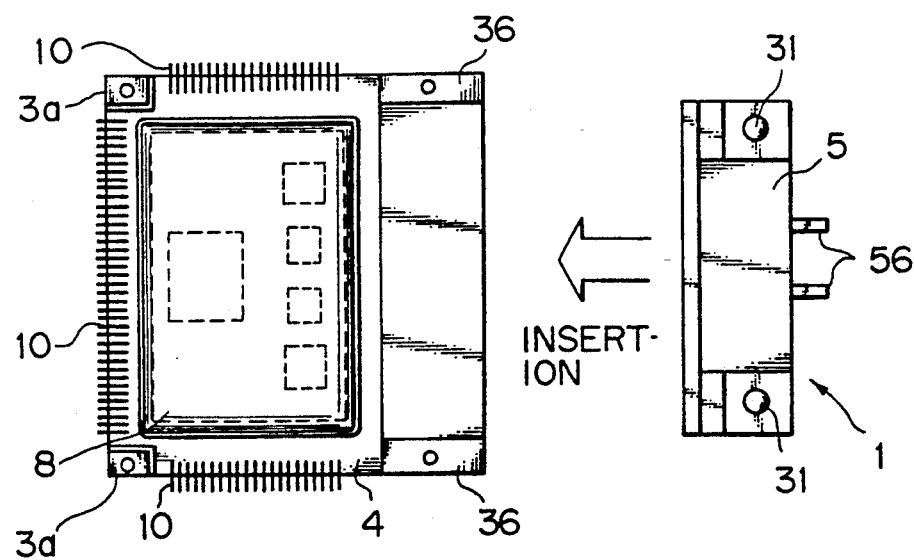
FIG. 10 shows the bonding relation between the electric circuit and the E/O and/or O/E converter in the embodiment of the present invention.

The junction between the electric circuit and E/O or O/E converter is described in detail below. As shown in FIG. 10, the E/O and/or O/E converter 5 is inserted into the electric circuit integrated with the radiation fin assembly as guided by the recess formed in the latter.

Figure 11:
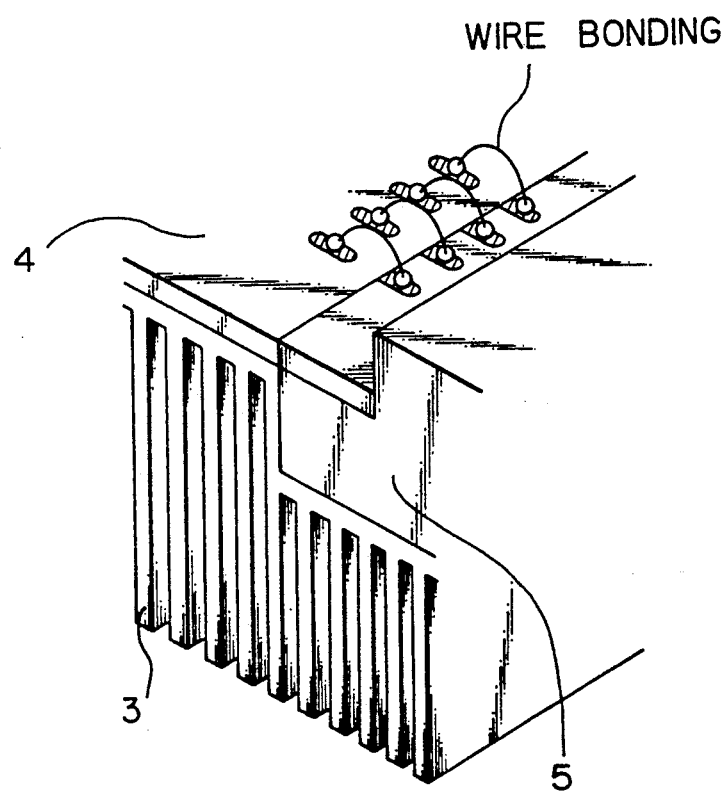
FIG. 11 shows the structure in which the electric circuit and E/O and/or O/E converter are joined to each other by wire bonding in the embodiment of the present invention.
Figure 12:
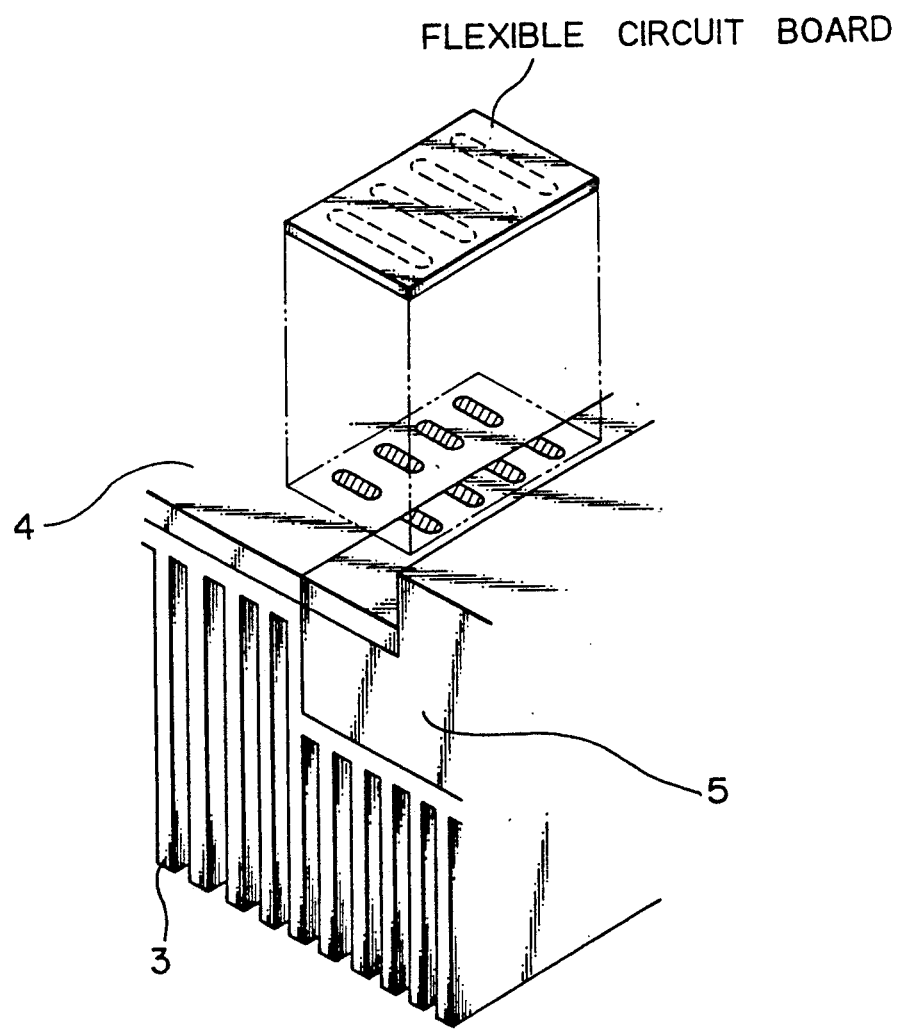
FIG. 12 shows the structure in which the electric circuit and E/O and/or O/E converter are joined to each other by a flexible printed circuit board in the embodiment of, the present invention.

FIGS. 11 and 12 are sectional views, enlarged in scale, of the junction between the electric circuit 4 and E/O and/or O/E converter 5.

The interconnecting terminals of the electric circuit and E/O and/or O/E converter are aligned to each other and guided by the recess in the radiation fin assembly. These terminals are electrically connected to each other by wire bonding (as in FIG. 11) or a flexible circuit board (as in FIG. 12).

Figure 9D:
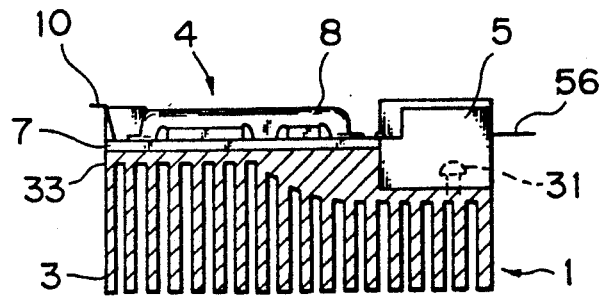

Thereafter, the electric circuit 4 is sealed and encased with the sealing case made of Kovar by utilizing the welding stem provided on the outer circumference of the electric circuit on the high-temperature radiation substrate (as in FIG. 9(D)). Thus, the hybrid optical-/electrical circuit module 1 is completed safely, and easily.

As described in the foregoing, according to the present invention, the electric circuit 4 and E/O and/or O/E converter 5 are mounted together on the radiation fin assembly 3 being a common base for both the electric circuit and the E/O and/or O/E converter, so the entire module 1 is extremely compact. Also, since the manufacturing process is simplified and facilitated, the cost and yield of production can be greatly improved. Furthermore, the electric circuit 4 is sealed separately from the E/O and/or O/E converter 5, so the module 1 can be easily repaired and the E/O and/or O/E converter 5 can be easily replaced. Moreover, since the high-temperature radiation substrate 7 and radiation fin assembly 3 are joined directly to each other, so that the thermal resistance is lower and heat can be efficiently radiated. Thus, the module 1 is more stable and reliable.

Figure 13A:
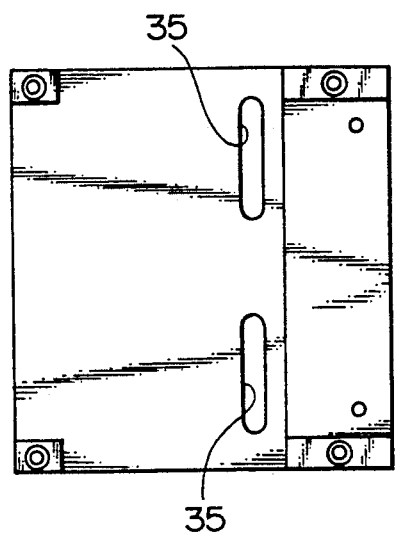
FIGS. 13(A) and 13(B) show a variant of the radiation fin assembly.
Figure 13B:
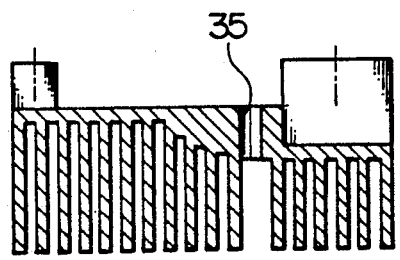
Figure 14A:
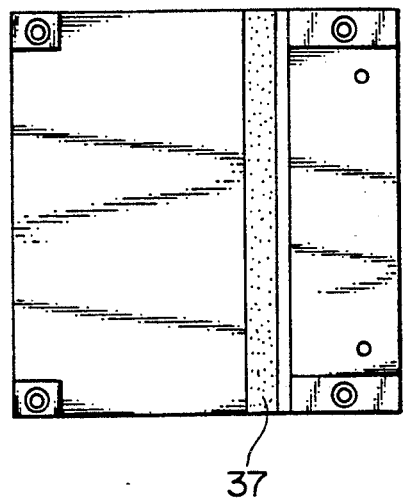
FIGS. 14(A) and 14(B) shows another variant of the radiation fin assembly.
Figure 14B:
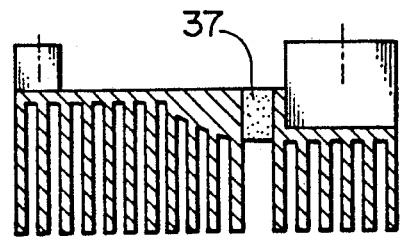

In place of the radiation fin assembly 3 detailed in FIGS. 4 to 6, there may be formed in areas where the electric circuit and E/O and/or O/E converter are mounted, respectively, elongated holes 35, for example, as shown in FIG. 13 to divide the radiation fin assembly into two blocks thermally isolated from each other, thereby protecting the E/O and/or O/E converter 5, which is easily influenced by heat. Otherwise, as shown in FIG. 14, the radiation fin assembly 3 may be divided into two blocks by the above-mentioned areas and a non-heat conductive material, for example, an epoxy resin member 37, may be inserted between such blocks, whereby the heat transferred from the radiation fin assembly on which the electric circuit is mounted can be effectively shut off.

Figure 15:
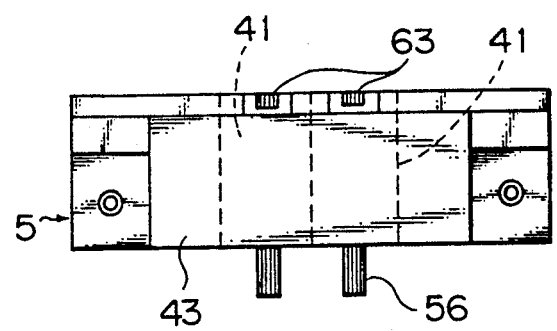
FIG. 15 is a plane view of the photo-coupler.
Figure 16:
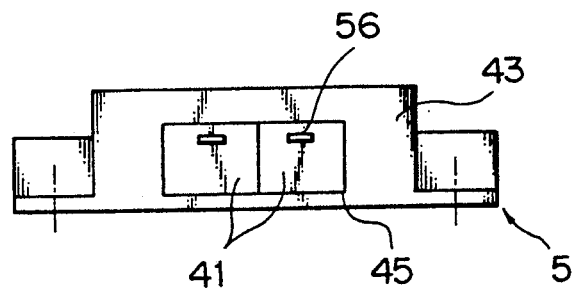
FIG. 16 is a front view of the photo-coupler.

As shown in FIGS. 15 and 16, the E/O and/or O/E converter 5 is made of two photo-coupling blocks 41 inserted into a photo-coupling holder 43 made of aluminum and fixed with a low-temperature setting adhesive 45 (for example, an epoxy resin settable at 80° C.).

Figure 17:
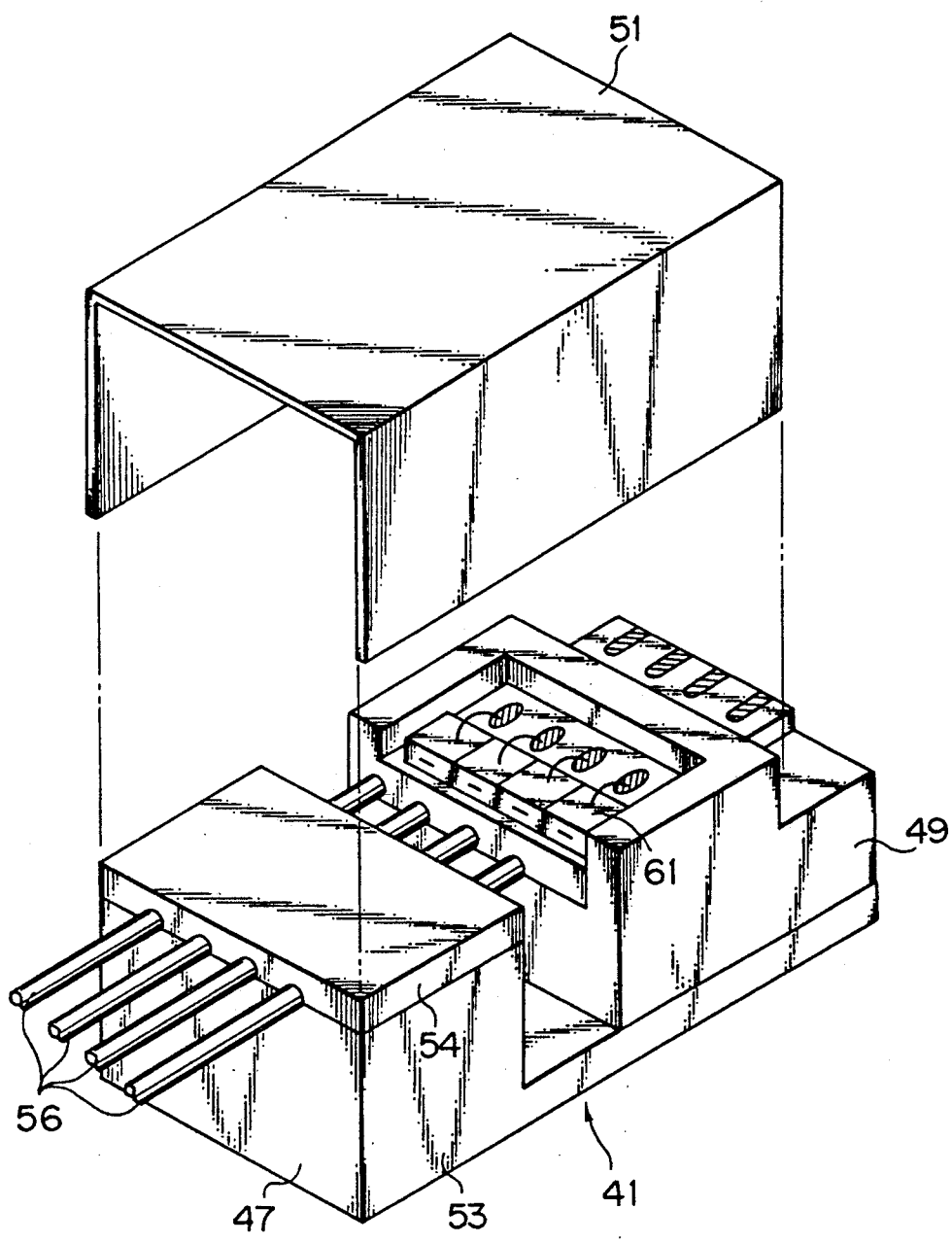
FIG. 17 is an enlarged perspective view of the photo-coupling block.
Figure 18:
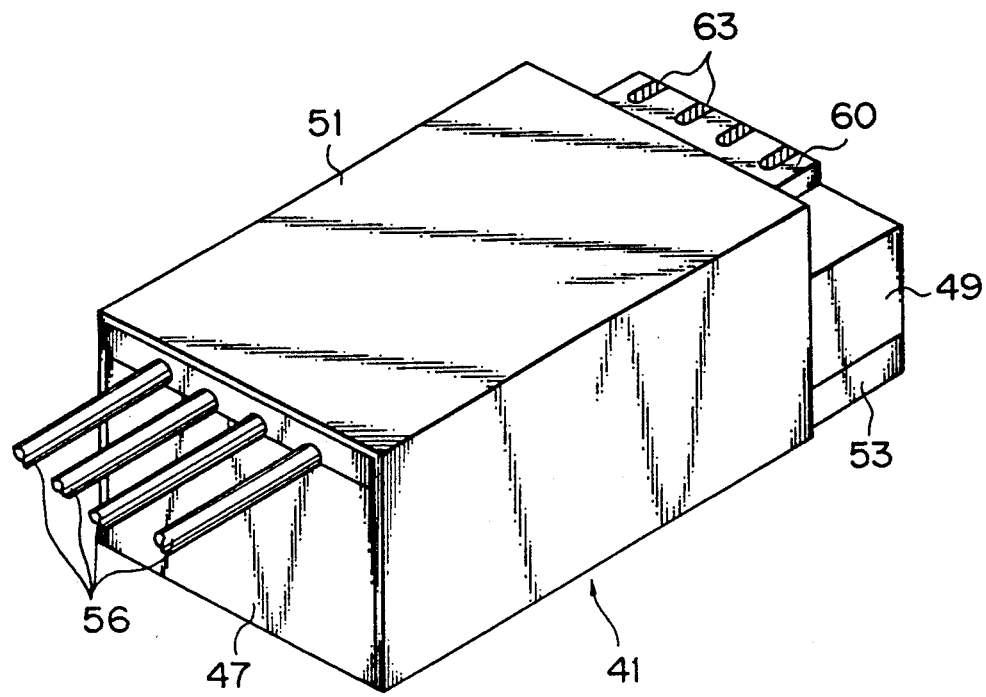
FIG. 18 is an assembled perspective view of the photo-coupling block.

The photo-coupling block 41 consists, as shown in FIGS. 17 and 18, of a fiber block 47, and LD block 49 that is mounted on the fiber block 47, and a U-shaped cover 51 made of Kovar that is put on both blocks 47 and 49 and laser-welded at the contact faces thereof.

Figure 19:
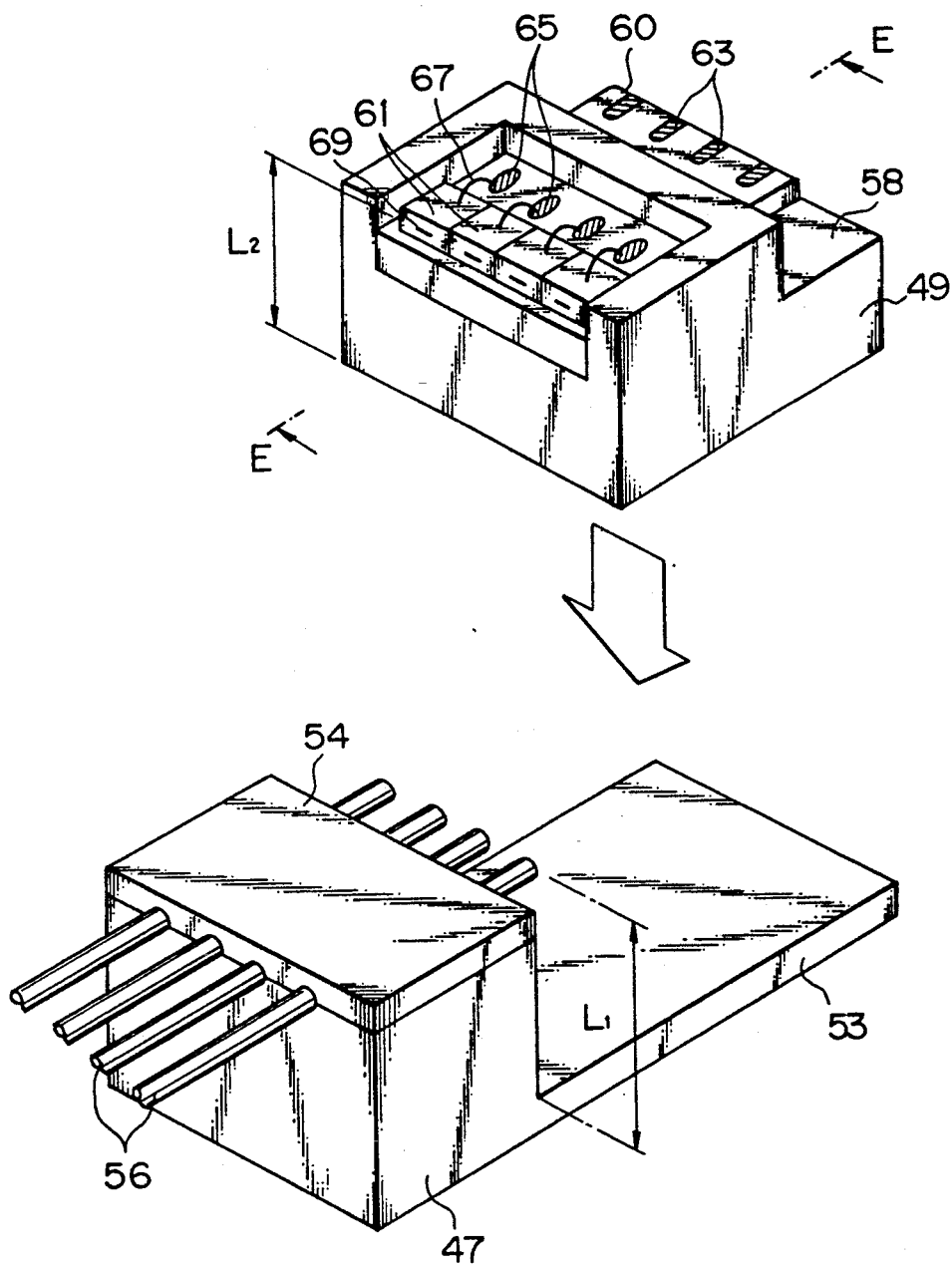
FIG. 19 is a perspective view of the fiber block and LD block.

The fiber block 47 has a base portion 53 made of Kovar and a keep plate 54 also made of Kovar, as shown in FIG. 19. The keep plate 54 retains four parallel optical fibers 56 under it on the top of the fiber block 47. Gold is deposited on the optical fibers at the covered portions. These three members 53, 54 and 56 are joined by soldering. The dimension $L_1$ (as shown in FIG. 19) from the reference surface on the base portion 53 to the center of the optical fibers 56 is in the order of plus or minus several microns per tenths.

Figure 20:
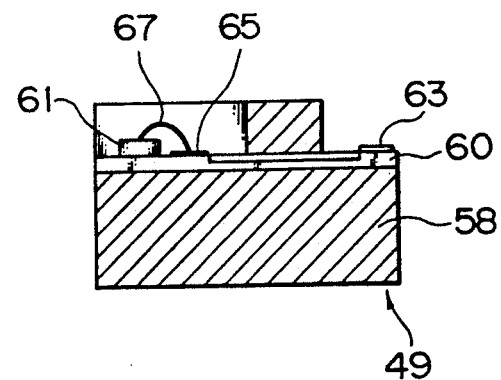
FIG. 20 is a sectional view taken along the line E—E of the LD block in FIG. 19.

As shown in FIG. 19 and FIG. 20 showing a cross section taken along the line E—E through the LD block 49, the LD block 49 comprises a base portion 58 made of Kovar, an AlN substrate 60 fixed as soldered to the base portion 58, and four LDs (laser diodes) 61 fixed in parallel formation on the substrate 60. The substrate 60 provides, at the rear thereof, an external interconnecting terminal 63 for electrical connection with the outside, and each bonding pad 65 of the electric circuit provided at the opposite side of the substrate is connected to a corresponding LD 61 by a bonding wire 67. The dimension $L_2$ from the reference surface (bottom) to the LD light emitter 69 of LD is equal to $L_1$ and it is in the order of plus or minus several microns per tenths.

Figure 21A:
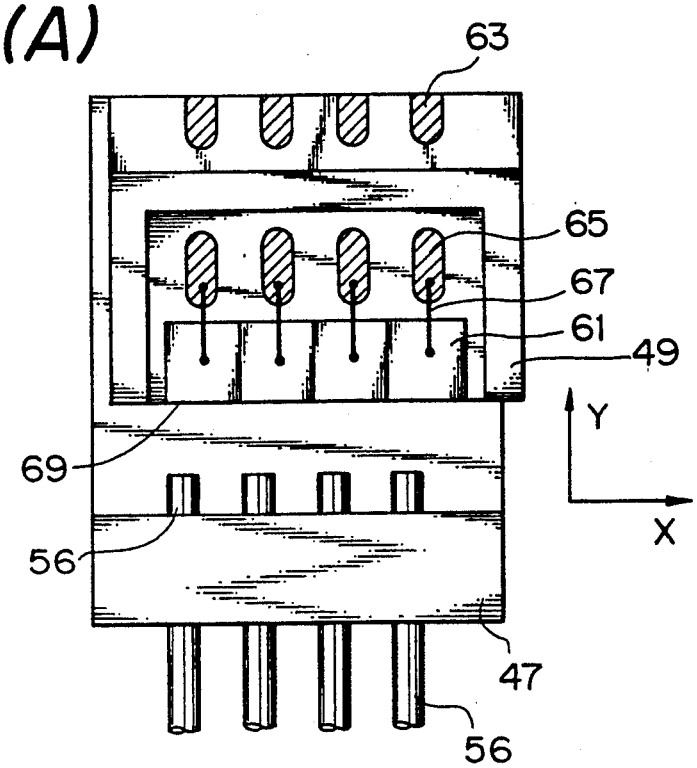
FIGS. 21(A) and 21(B) are a plane view of the fiber block and the LD block before and after the optical axis is aligned.
Figure 21B:
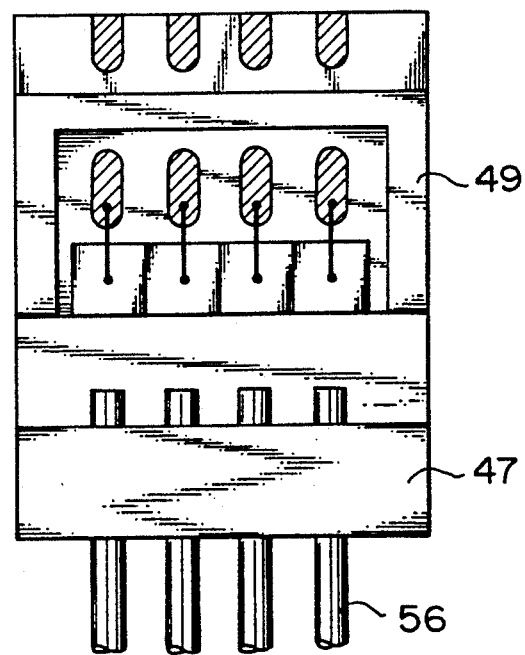
Figure 22:
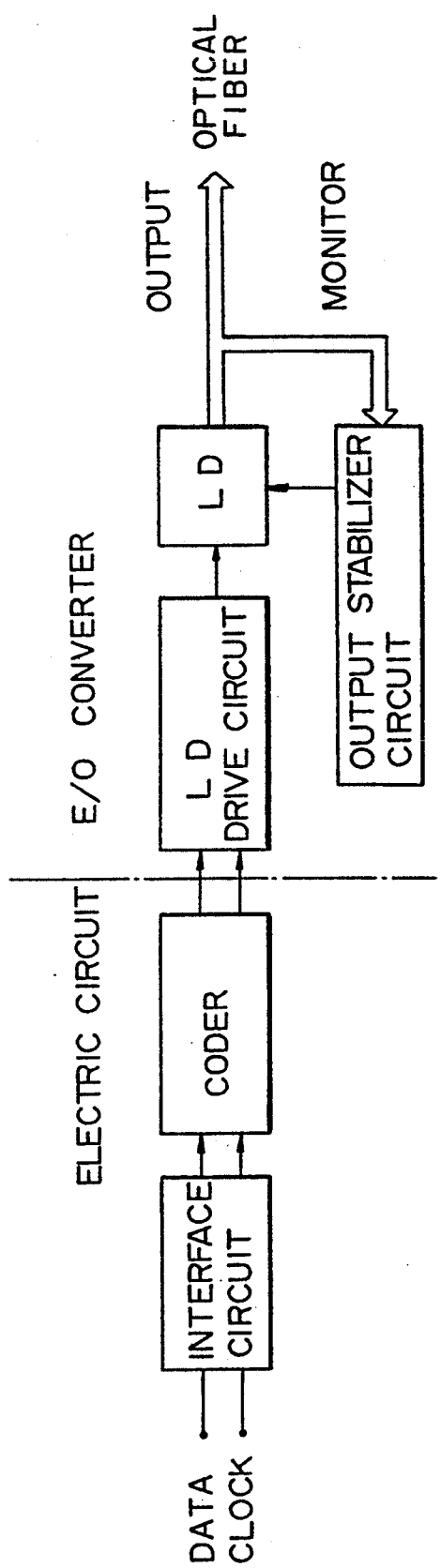
FIG. 22 is a schematic block diagram of an example E/O module.
Figure 23:
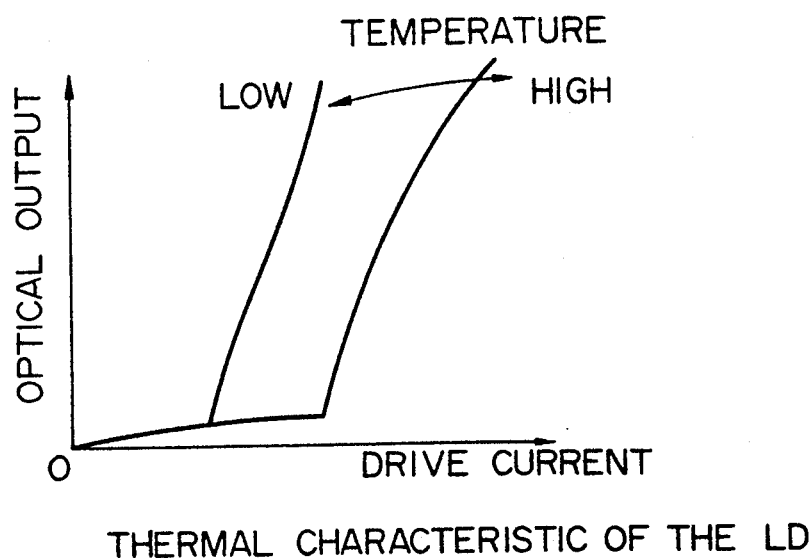
FIG. 23 shows the thermal characteristic of the LD.
Figure 24:
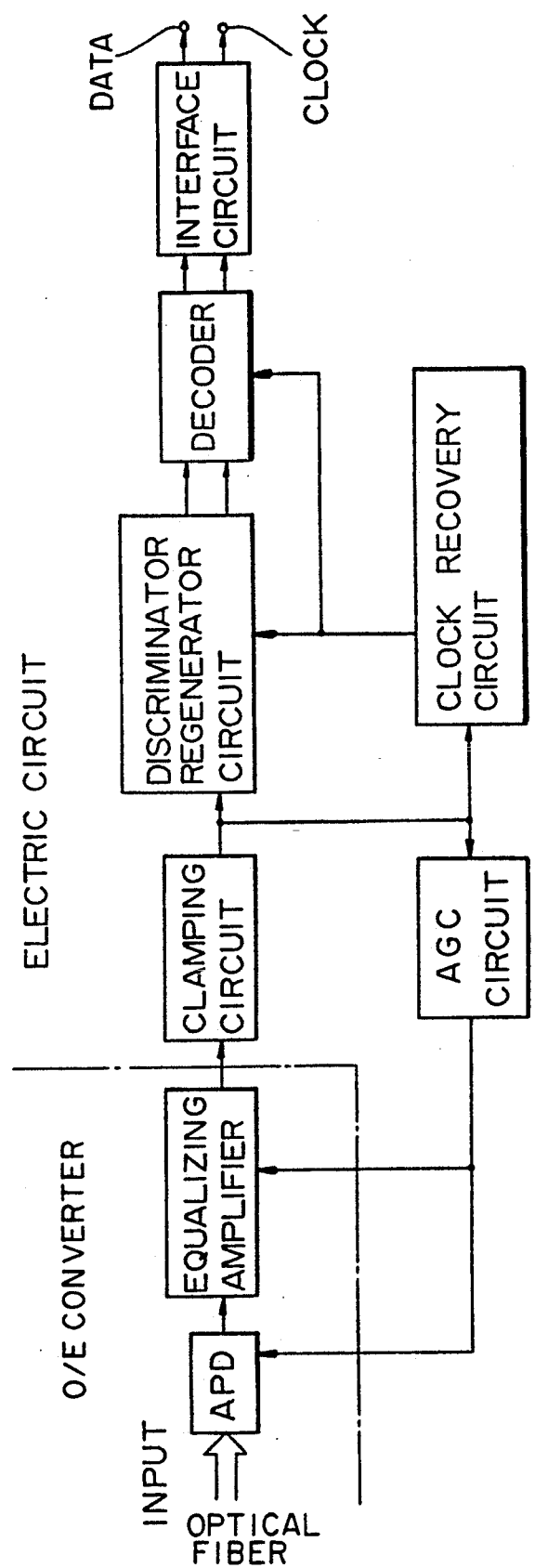
FIG. 24 is a schematic block diagram of an example O/E module.
Figure 25:
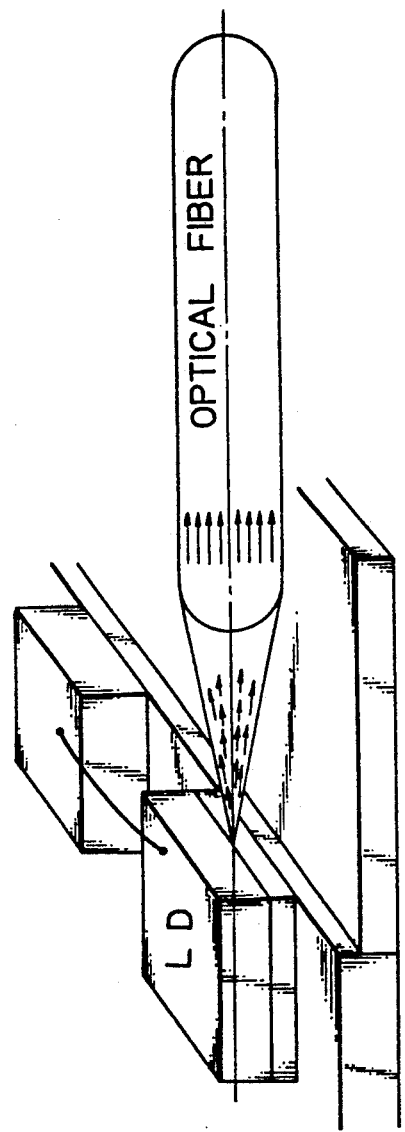
FIG. 25 shows the geometrical relation between the LD and the optical fiber.
Figure 26:
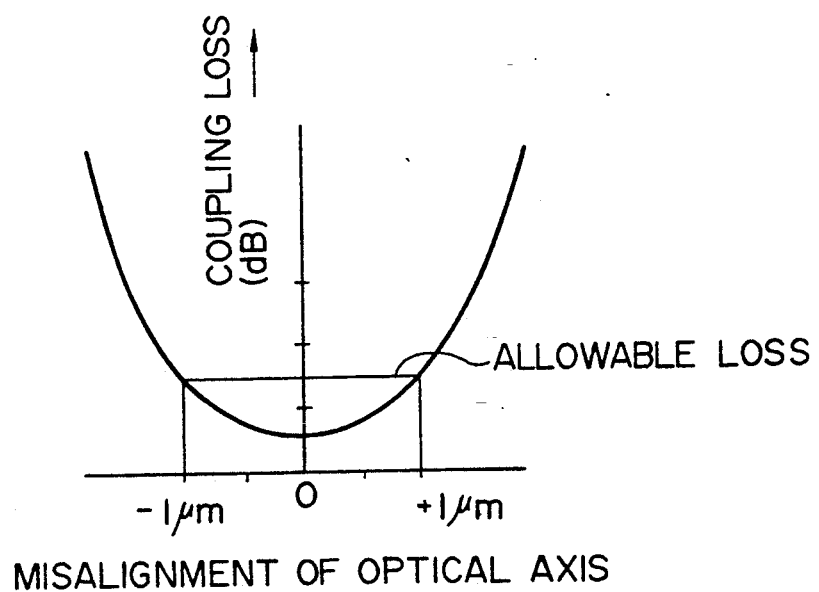
FIG. 26 shows the relation between the misalignment of the optical axis and coupling loss.

The fiber block 47 and LD block 47 are optically coupled to each other by setting the LD block 49 on the fiber block 47 (as in FIG. 19), sliding the LD block 49 in X- and Y-directions (as in FIG. 21) and aligning it so that misalignment of the optical axis is several microns or less. The Y-directional dimensions of the end face of the optical fiber 56 and LD 61 are normally 20 to 50 microns. After aligning, both members 47 and 49 are joined together by laser spot-welding or the like.

As described in the foregoing, the present invention overcomes the drawbacks of the prior art and provides a hybrid optical/electrical circuit module highly reliable and stable that can be easily manufactured at less cost.

It is to be understood that the invention is by no means limited to the specific embodiments illustrated and described herein, and that various modifications thereof may be made which come within the scope of the present invention as defined in the appended claims.

I claim:

1. A hybrid optical/electrical circuit module comprising:
   a radiation fin assembly;
   an electric circuit which is secured to said radiation fin assembly by a first securing means having a relatively high heat conductivity, such that heat generated by said electric circuit can be effectively removed; said electric circuit including at least one of a decoder and a coder; and
   an optical/electrical converter and is secured to said radiation fin assembly by a second securing means such that said optical/electrical converter is thermally insulated from said electric circuit.

2. A hybrid optical/electrical circuit module according to claim 1, wherein said first securing means comprises a fused-metal junction.

3. A hybrid optical/electrical circuit module according to claim 1, wherein said optical/electrical converter and said electric circuit each individually have a hermetic seal.

4. A hybrid optical/electrical circuit module according to claim 1, wherein said optical/electrical converter and said electric circuit each have respective external interconnecting terminals, and wherein said respective external interconnecting terminals are electrically connected to each other at corresponding ones of said external interconnecting terminals.

5. A hybrid optical/electrical circuit module according to claim 1, wherein said radiation fin assembly includes two blocks on which said optical/electrical converter and said electric circuit are respectively mounted, and further comprising at least one hole disposed between said two blocks such that said two blocks are thereby thermally isolated from each other.

6. A hybrid optical/electrical circuits module according to claim 1, wherein said radiation fin assembly includes two separated heat conducting members having an insulating member filling the separation between said two separated heat conducting members, said two separated heat conducting members respectively corresponding to said two blocks, said two blocks thereby being thermally isolated from each other by said insulating member.

7. A hybrid optical/electrical circuit module according to claim 1, wherein said radiation fin assembly has a recess therein which has recess walls, said recess receiving said optical/electrical converter and wherein said electric circuit and said optical/electrical converter are maintained in alignment with each other by said recess walls, and wherein said electric circuit and said optical/electrical converter are electrically connected to each other with an electrically conducting means.

8. A hybrid optical/electrical output module according to claim 1, wherein said radiation fin assembly further comprises a plurality of stems, each of said plurality of stems having a screw hole respectively disposed therein adapted for attachment to a circuit board, and wherein said electric circuit further comprises a plurality of terminals which are higher than each of said plurality of stems, such that said terminals are adapted to be in resilient press contact with corresponding terminals of the circuit board when in a mounted condition on.

9. A hybrid optical/electrical circuit module according to claim 1, wherein said first securing means comprises a high-temperature conductive adhesive.

10. A hybrid optical/electrical circuit module according to claim 9, wherein said second securing means comprises a mechanical fixing member.

11. A hybrid optical/electrical circuit module according to claim 9, wherein said second securing means comprises a partial fused-metal junction.

12. A hybrid optical/electrical circuit module according to claim 2, wherein said second securing means comprises a mechanical fixing member.

13. A hybrid optical/electrical circuit module according to claim 2, wherein said second securing means comprises a partial fused-metal junction.

14. A hybrid optical/electrical circuit module comprising:
    a radiation fin assembly;
    an electric circuit which is secured to said radiation fin assembly by a first securing means having a relatively high heat conductivity, such that heat generated by said electric circuit can be effectively removed; said electric circuit including at least one of a decoder and a coder; and
    an electrical/optical converter to be electrically connected with said electric circuit, and is secured to said radiation fin assembly by a second securing means such that said electrical/optical converter is thermally insulated from said electric circuit.

15. A hybrid optical/electrical circuit module according to claim 14, wherein said first securing means comprises a fused-metal junction.

16. A hybrid optical/electrical circuit module according to claim 14, wherein said electrical/optical converter and said electric circuit each individually have a hermetic seal.

17. A hybrid optical/electrical circuit module according to claim 14, wherein said optical/electrical converter and said electric circuit each have respective external interconnecting terminals, and wherein said respective external interconnecting terminals are electrically connected to each other at corresponding ones of said external interconnecting terminals.

18. A hybrid optical/electrical circuit module according to claim 14, wherein said radiation fin assembly includes two blocks on which said electrical/optical converter and said electric circuit are respectively mounted, and further comprising at least one hole disposed between said two blocks such that said two blocks are thereby thermally isolated from each other.

19. A hybrid optical/electrical circuit module according to claim 14, wherein said radiation fin assembly includes two separated heat conducting members having an insulating member filling the separation between said two separated heat conducting members, said two separate heat conducting members corresponding to said two blocks, said two blocks thereby being thermally isolated from each other by said insulating member.

20. A hybrid optical/electrical circuit module according to claim 14, wherein said radiation fin assembly has a recess therein which has recess walls, said recess receiving said electrical/optical converter, and wherein said electric circuit and said electrical/optical converter are maintained in alignment with each other by said recess walls, and wherein said electric circuit and said electrical/optical converter are electrically connected to each other with an electrically conducting means.

21. A hybrid optical/electrical circuit module according to claim 14, wherein said radiation fin assembly further comprises a plurality of stems, each or said plurality of stems having a screw hole respectively disposed therein adapted for attachment to a circuit board, and wherein said electric circuit further comprises a plurality of terminals which are higher than each of said plurality of steams, such that said terminals are adapted to be in resilient press contact with corresponding terminals of the circuit board when in a mounted condition on the circuit board.

22. A hybrid optical/electrical circuit module according to claim 14, wherein said first securing means comprises a high-temperature conductive adhesive.

23. A hybrid optical/electrical circuit module according to claim 22, wherein said second securing means comprises a mechanical fixing member.

24. A hybrid optical/electrical circuit module according to claim 22, wherein said second securing means comprises a partial fused metal junction.

25. A hybrid optical/electrical circuit module according to claim 15, wherein said second securing means comprises a mechanical fixing member.

26. A hybrid optical/electrical circuit module according to claim 15, wherein said second securing means comprises a partial fused-metal junction.

* * * * *